US010725079B2

(12) United States Patent
Kvarnstrand

(10) Patent No.: US 10,725,079 B2
(45) Date of Patent: Jul. 28, 2020

(54) ARRANGEMENT AND METHOD FOR MEASURING THE PERFORMANCE OF DEVICES WITH WIRELESS CAPABILITY

(71) Applicant: Bluetest AB, Göteborg (SE)

(72) Inventor: John Kvarnstrand, Floda (SE)

(73) Assignee: Bluetest AB, Gothenburg (SE)

( * ) Notice: Subject to any disclaimer, the term of this patent is extended or adjusted under 35 U.S.C. 154(b) by 0 days.

(21) Appl. No.: 16/490,963

(22) PCT Filed: Mar. 5, 2018

(86) PCT No.: PCT/SE2018/050208
§ 371 (c)(1),
(2) Date: Sep. 4, 2019

(87) PCT Pub. No.: WO2018/164627
PCT Pub. Date: Sep. 13, 2018

(65) Prior Publication Data
US 2019/0391195 A1 Dec. 26, 2019

(30) Foreign Application Priority Data
Mar. 6, 2017 (SE) ...................................... 1750243

(51) Int. Cl.
*H04B 17/00* (2015.01)
*G01R 29/08* (2006.01)
(Continued)

(52) U.S. Cl.
CPC ......... *G01R 29/0821* (2013.01); *H04B 17/15* (2015.01); *H04B 17/29* (2015.01)

(58) Field of Classification Search
USPC ...................... 455/67.11, 67.12, 115.1, 115.2
See application file for complete search history.

(56) References Cited

U.S. PATENT DOCUMENTS

2004/0075443 A1* 4/2004 Hemming .......... G01R 29/0821
324/637
2008/0305754 A1* 12/2008 Foegelle ................ H04B 17/20
455/115.1
(Continued)

FOREIGN PATENT DOCUMENTS

DE 19812923 9/1999
DE 19812923 A1 9/1999
(Continued)

OTHER PUBLICATIONS

International Search Report and Written Opinion for PCT Application No. PCT/SE2018/050208 filed May 3, 2018 (published as WO2018/164627 on Sep. 13, 2018), which is the parent application to the instant application, dated May 31, 2018, 11 pages.
(Continued)

Primary Examiner — Ankur Jain
Assistant Examiner — Max Mathew
(74) Attorney, Agent, or Firm — Harness, Dickey & Pierce, P.L.C.; Anthony G. Fussner

(57) ABSTRACT

A new measurement arrangement and method for measuring the performance of a device under test, such as an antenna, a mobile phone and other wireless terminals, are disclosed. The chamber defines an internal cavity therein, adapted to enclose the device under test, and including walls of an inwardly reflective material, rendering the walls reflective to electromagnetic waves, thereby simulating a multi-path environment. Thus, the chamber is a reverberation chamber. Further, at least one first chamber antenna and at least one second chamber antenna, are arranged in the cavity, the first and second chamber antennas being configured to transmit and receive electromagnetic waves within a first predefined frequency range and within a second predefined frequency range, respectively. A measuring instrument is connected to the device under test and the chamber antennas, for mea-
(Continued)

suring the transmission between them. Furthermore, a frequency selective absorber is arranged in the cavity, the frequency selective absorber being arranged to absorb electromagnetic waves having a frequency within the first predefined frequency range and reflect electromagnetic waves having a frequency within the second predefined frequency range. Hereby, a measurement arrangement capable of testing of devices having wireless capability according to coming mobile communication standards is presented.

12 Claims, 4 Drawing Sheets

(51) Int. Cl.
  *H04B 17/15* (2015.01)
  *H04B 17/29* (2015.01)

(56) References Cited

U.S. PATENT DOCUMENTS

| | | | |
|---|---|---|---|
| 2010/0014571 A1* | 1/2010 | Horton | H04B 7/18506 375/227 |
| 2012/0053879 A1* | 3/2012 | Chang | H04B 17/21 702/104 |
| 2013/0052962 A1* | 2/2013 | Hansen | G01R 29/105 455/67.12 |
| 2014/0141727 A1* | 5/2014 | Kildal | H04B 17/15 455/67.12 |
| 2014/0338471 A1* | 11/2014 | Sayler | G01N 21/8806 73/865.6 |
| 2015/0017928 A1* | 1/2015 | Griesing | H04B 17/0087 455/67.14 |
| 2015/0025818 A1* | 1/2015 | Das | G01R 31/319 702/58 |
| 2015/0149108 A1* | 5/2015 | Cozza | G01R 29/0821 702/124 |
| 2016/0252554 A1* | 9/2016 | Opitz | G01R 1/18 324/612 |
| 2016/0274067 A1* | 9/2016 | Walker | G01N 29/036 |
| 2018/0340968 A1* | 11/2018 | Abadie | H04B 17/14 |

FOREIGN PATENT DOCUMENTS

| | | |
|---|---|---|
| JP | 2012127667 | 7/2012 |
| JP | 2012127667 A | 7/2012 |
| WO | WO2010059103 | 5/2010 |
| WO | WO-2010059103 A1 | 5/2010 |
| WO | WO2012171562 | 12/2012 |
| WO | WO-2012171562 A1 | 12/2012 |
| WO | WO2015007982 | 1/2015 |
| WO | WO-2015007982 A1 | 1/2015 |

OTHER PUBLICATIONS

Swedish Search Report for Swedish patent application No. 1750243-6 filed Mar. 6, 2017 which is the parent application to the instant application, dated Nov. 17, 2017, 2 pages.

* cited by examiner

ARRANGEMENT AND METHOD FOR MEASURING THE PERFORMANCE OF DEVICES WITH WIRELESS CAPABILITY

This patent application is a U.S. national stage filing under 35 U.S.C. § 371 of PCT International Application No. PCT/SE2018/050208 filed Mar. 5, 2018 (published as WO2018/164627 on Sep. 13, 2018), which claims priority to and the benefit of Swedish Application No. 1750243-6 filed Mar. 6, 2017. The entire contents of these applications are incorporated herein by reference.

TECHNICAL FIELD OF THE INVENTION

The present invention relates to an improved arrangement and method for measuring the performance of a device under test (DUT) having wireless capability. More specifically, the present invention relates to reverberation chambers.

BACKGROUND

The reverberation chambers, or mode-stirred chambers, have in recent years become effective tools in testing e.g. Over-the-Air performance of various wireless communication devices. Such chambers provide a straightforward solution to testing of devices that rely on multipath signal propagation for communication, often known as MIMO (Multiple Input Multiple Output) technologies, and for devices that simultaneously operate using several frequency bands, etc.

The U.S. Pat. Nos. 7,444,264 and 7,286,961, by the same applicant, discloses such reverberation chambers useable to measure e.g. the radiation efficiency of antennas and the total radiated power (TRP) of mobile and wireless terminals such as cellular phones. The same measurement setups that are described in U.S. Pat. Nos. 7,444,264 and 7,286,961 were also used to determine the performance of antenna diversity. Such reverberation chambers can be used to measure transmitting performance in a fading multipath environment, and/or to measure the receive performance by a Bit-Error-Rate (BER) or a Frame-Error-Rate (FER), depending on which system the terminals are designed for.

The reverberation chamber can by making use of the above previous inventions be used for characterizing the complete performance of mobile and wireless terminals, both on transmit and receive, including transmit and receive performance of antennas, amplifiers, signal processing algorithms, and coding. This has opened up a large potential for RF testing in connection with terminals for more advanced mobile communication systems referred to as 3G and 4G (third and fourth generation of mobile communication systems, also called LTE). Such systems make use of more than one antenna for both transmission and reception and will use these to adapt to the fading multipath environment, in order to improve battery life time and data rate. Such systems are known under terms as diversity antenna systems and MIMO (Multiple Input Multiple Output) antenna systems. In order to develop optimum diversity and MIMO systems it will be more important than ever to quantify the performance of the terminals and base station simulators in multipath environments. The reverberation chamber can provide this testing opportunity.

The ultimate testing opportunity of the reverberation chamber is to measure data throughput of the whole communication system with diversity and MIMO capability, from the data input at the base station to the data output at the terminal, or vice versa. This contains the effects of radiated power, the wireless channel and receiver sensitivity in one performance value, referred to as the throughput, being the most important for the user. This throughput is a resulting data transfer rate, and the measurement setup in reverberation chamber is already described in scientific paper (J. Åsberg, A. Skåarbratt, and C. Orlenius, "Over-the-air performance testing of wire-less terminals by data throughput measurements in reverberation chamber", European Conference on Antennas and Propagation ICAP 2011, 11-15 Apr. 2011, Rome).

The reverberation chamber can always be improved with respect to both measurement accuracy and resemblance to practical environments. The uncertainty is at present good enough compared to alternative measurement techniques, but a more accurate chamber will allow measurements at a lower frequency or in a smaller chamber and at shorter time, which is attractive. The reverberation chamber represents an isotropic multipath environment with a uniform distribution of angles of arrival of the incoming waves over the complete surrounding space. This is a good reference environment for antennas and wireless terminals in multipath with fading.

However, we are part of a rapidly changing world with technological advancements being made in all fields of technology every year. Particularly in the field of wireless technology and telecommunications where there is a new generation of mobile standards approaching, namely the fifth generation (5G), where new problems and technological challenges await. In more detail, in the next generation of mobile standards, devices will possibly be required to be able to both communicate at current frequency ranges 450 MHz-6 GHz and also at higher frequencies, in the range of, 6-100 GHz, which consequently will present new challenges in regards to testing of higher frequencies since the propagation properties of a wireless link is different at the higher frequencies, with less pronounced multipath.

Thus, despite the improvements in measurement accuracy obtained by means of the reverberation chamber in recent years, there is still a need for improvements to support testing of certain devices, and e.g. devices operating under the expected coming generations of mobile standards.

SUMMARY OF THE INVENTION

It is therefore an object of the present invention to provide a method and an apparatus which alleviates all or at least some of the above-discussed drawbacks of the presently known systems.

This object is achieved by means of an apparatus and a method as defined in the appended claims.

This object is achieved by means of a measurement arrangement and a method for measuring the performance of a device under test as defined in the appended claims.

According to a first aspect of the invention, there is provided a measurement arrangement for measuring the performance of a device under test, comprising:

a chamber defining an internal cavity therein, adapted to enclose the device under test, and including walls having inwardly facing surfaces of an electromagnetically reflective material, thereby simulating a multi-path environment;

at least one first chamber antenna arranged in the cavity and configured to transmit and receive electromagnetic waves having a frequency within a first predefined frequency range, at least one second chamber antenna arranged in the cavity and configured to transmit and receive electromagnetic waves having a frequency within a second predefined frequency range, a measuring instrument connected to the device under test and the first chamber antenna and the second chamber antenna, for measuring the transmission between the device under test and the chamber antennas;

wherein the measurement arrangement further comprises at least one frequency selective absorber arranged in the cavity, the frequency absorber being arranged to absorb electromagnetic waves having a frequency within the first predefined frequency range and reflect electromagnetic waves having a frequency within the second predefined frequency range.

Hereby, a measurement arrangement that can be used for characterizing the performance of e.g. mobile wireless terminals, both on transmit and receive, including transmit and receive performance of antennas, amplifiers, signal processing algorithms and coding, is presented. Moreover, the system is compatible for RF (Radio Frequency) testing of terminals for 5G (fifth generation of mobile communication systems). Such systems, as well as predecessors such as 4G, make use of more than one antenna for both transmission and reception and will use these to adapt to the fading multipath environment, in order to improve battery life time and data rate. Such systems are known under terms as diversity antenna systems and MIMO (Multiple Input Multiple Output) antenna systems. In order to develop optimum diversity and MIMO systems it is more important than ever to quantify the performance of these terminals and base station simulators.

However, for the coming fifth generation of mobile standards (5G) it is envisioned, as discussed in the background section, that the mobile wireless terminals will be required to communicate at two different frequency ranges. At the higher frequencies the transmission of data will be of a more direct character due to the different propagation properties (e.g. less pronounced multipath) of a wireless link at higher frequencies. Thus by means of the inventive measurement arrangement a line-of-sight component of a propagation channel may be introduced by utilizing two antennas operating at different frequency ranges within the chamber and by arranging frequency selective absorbers within the same chamber.

Thus, by means of the present invention, the chamber may function as a reverberation chamber for certain frequencies, and at the same time function as an anechoic or partly anechoic chamber for other frequencies.

The term "device under test" is in the context of this application used to indicate any type of device capable of transmitting or receiving electromagnetic signals through a wireless interface. In particular, the device under test can be antennas, mobile phones and other wireless terminals.

The term "walls", is, in the context of the present application and the herein disclosed chamber, used to describe walls in any orientation, i.e. including sidewalls, ceiling and floor.

Conventionally known reverberation chambers, i.e. chambers having cavity composed of internally reflective walls, which are used to measure the performances of wireless mobile terminals at lower frequencies (below 6 GHz in the present context), may be less suited for the coming 5G standards, as there is no way to measure the transmission/receiving performance in a direct line-of-sight setup between a chamber antenna and the device under test. Therefore, the present inventors realized that the delay spread (dispersion in time that signals arrive at the device under test while passing through several different trajectories) can be modified by adding frequency selective absorbers to the reverberation chamber. This is in order to tune the fading environment in the reverberation chamber so that it has different properties at different frequencies. Consequently it is now possible to test devices that communicate simultaneously at different frequencies, and more specifically to test them with fading environments that are different at the different frequencies, as would be in real-world conditions.

In one embodiment of the present invention, the at least one first chamber antenna and the at least one second chamber antenna are arranged to operate simultaneously.

The first and second predefined frequency ranges are preferably distinct and non-overlapping in relation to each other.

The first predefined frequency range may be lower than the second predefined frequency range. However, for most measurement situations it will be preferred that the first predefined frequency range is at a higher frequency band than the second predefined frequency range.

The first predefined frequency range may be above 1 GHz, preferably above 5 GHz, and most preferably above 10 GHz.

Further, the first predefined frequency range may be within the range between 5 GHz and 200 GHz, preferably between 6 GHz and 150 GHz and most preferably between 6 GHz and 100 GHz. For example, depending on the specific testing conditions the at least one first chamber antenna may be configured to operate in at least one frequency band selected from the group including: 8.5-10.6 GHz, 13.4-15.2 GHz, 15.7-17.3 GHz, 19.7-21.2 GHz, 24.25-27.5 GHz, 27.5-29.5 GHz, 37-40.5 GHz, 45.5-47 GHz, 47.2-50.2 GHz, 50.4-52.6 GHz, 59.3-71 GHz, 66-76 GHz, 81-86 GHz and 92-100 GHz.

The second predefined frequency range may be below 10 GHz, preferably below 5 GHz, and most preferably below 1 GHz.

Further, the second predefined frequency range may be within the range between 100 MHz and 10 GHz, preferably between 300 MHz and 8.5 GHz and most preferably between 400 MHz and 6 GHz.

In the above-discussed embodiments, two frequency ranges are provided. However, more than two frequency ranges may also be used, and the measurement apparatus may be designed to absorb or reflect all of said frequency ranges to the same or various degrees. It is also possible to provide different frequency ranges for different polarities.

In yet another embodiment of the present invention, the at least one first chamber antenna and the at least one second chamber antenna are arranged at spatially separated locations in the cavity. Furthermore, the at least one first chamber antenna may be arranged with a free line-of-sight to the device under test. A free line-of-sight in the context of the present application is to be understood as a set-up where the propagation of an electromagnetic wave between a transmitter and a receiver is arranged without any obstructing bodies disposed between the two. By arranging a chamber antenna with a free line-of-sight to the device under test one can create a Rician fading environment with a substantial K-factor, thereby further increasing the accuracy of the real-life simulation within the testing chamber.

Further, in yet another embodiment of the present invention, the measurement arrangement further comprises a shielding structure arranged between the device under test and the at least one second chamber antenna, such that a line of sight between the device under test and the at least one second chamber antenna is obscured. By means of such a shield, the direct coupling between the second chamber antenna(s) and the device under test is strongly reduced, and at the same time, the shield does only insignificantly reduce the multimode distribution within the chamber. Hereby, the measurement accuracy is improved. The shield may have a width extension between two opposing side walls of the chamber in the range of 40-80%, and preferably 50-75%, of the distance between said opposing side walls, and a height extension between a roof and a floor of the chamber in the range 20-80%, and preferably 50-70%, of the distance between said floor and roof.

The frequency selective absorber may be arranged as stand-alone objects arranged within the chamber, such as in the form of a cylinder, a shield, a cube, a cone, a pyramid or the like. However, preferably the frequency selective absorber is at least partly provided on the walls of the chamber, thereby at least partly covering the inwardly facing surfaces of said walls. Preferably, the frequency selective absorber is provided to cover at least 5% of the internal wall area, and preferably at least 10%, and more preferably at least 25%, and most preferably at least 50%. The frequency selective absorber may be arranged to cover 100% of the internal wall surface, but preferably at least part of the internal wall surface is not covered by the frequency selective absorber, such as at least 5%, or at least 10%, or at least 25%.

Further, in yet another embodiment of the present invention, the frequency selective absorber comprises an absorbing body at least partially covered by an electrically conductive grid, such as a wire mesh. The term electrically conductive grid (or perforated electrically conductive screen) is in the present context considered to be reflective in terms of electromagnetic waves being reflected by the grid. Moreover, the term is to be interpreted broadly and is considered to include a perforated sheet (i.e. a sheet of electrically conductive material (or electromagnetically reflective material) having a plurality of through holes or openings) as well as a wire mesh or a metallic grid. The size of the holes or openings may be varied in accordance with the intended application, whereby it is possible to control which electromagnetic waves are reflected and which are absorbed based on the frequency of the incident electromagnetic wave. For example, if the sizes of the holes/openings are small relative to the wavelength of an incident electromagnetic signal then that electromagnetic wave is mostly reflected with only a minor amount transmitted through the electrically conductive grid. Consequently, if the hole/openings are large relative to the wavelength of an incident electromagnetic signal, then that signal is mostly transmitted through the electrically conductive grid with only a minor amount reflected.

Therefore, in yet another embodiment of the present invention, the electrically conductive grid comprises holes of a predefined dimension, the predefined dimension being based on a wavelength of transmitted electromagnetic waves from the first chamber antenna. Hereby the electromagnetic signals transmitted by the first chamber antenna can effectively be absorbed. Moreover, by enclosing absorber in a electrically conductive grid and placing them within the chamber (e.g. on the walls of the chamber) an environment can be created that is close to fully reverberant, high Q, high delay spread at low frequencies and close to anechoic at higher frequencies. Moreover, by altering the proportion of how much of the walls are covered by the frequency selective absorber, any desired intermediate performance can be achieved.

Antennas having direct line of sight and antennas having no direct line of sight can be combined in various ways. The chamber of the present invention can have:

0, 1, 2 or more antennas without line of sight to the DUT, e.g. by provision of shielding.

0, 1, 2 or more antennas with line of sight to a DUT, where the DUT is arranged stationary in the chamber. Hereby, a fixed geometrical relation between the DUT and the antenna(s) is provided.

0, 1, 2 or more antennas with line of sight to a DUT, where the DUT is moveably arranged in the chamber, and e.g. mounted on a turntable. Hereby, a variable or varying geometrical relation between the DUT and the antenna(s) is provided.

0, 1, 2 or more antennas with line of sight to a DUT, where the DUT is moveably arranged in the chamber, and e.g. mounted on a turntable, and the antenna(s) is arranged on the same moving arrangement, so that even though both the antenna(s) and the DUT are moving, a fixed geometrical relation between the DUT and the antenna(s) is provided.

Further, in accordance with another aspect of the present invention there is provided a method for measuring the performance of a device under test, comprising:

arranging a device under test within a chamber defining an internal cavity therein, and including walls having inwardly facing surfaces of an electromagnetically reflective material, thereby simulating a multi-path environment;

arranging at least one first chamber antenna in the cavity and at least one second chamber antenna in the cavity, wherein said at least one first chamber antenna is configured to transmit and/or receive electromagnetic waves of a first predefined frequency range and said at least one second chamber antenna is configured to transmit and/or receive electromagnetic waves of a second predefined frequency range;

absorbing electromagnetic waves of said first predefined frequency range transmitted within said chamber; and reflecting electromagnetic waves of said second predefined frequency range transmitted within said chamber;

measuring a transmission between the device under test and said at least one first chamber antenna and said at least one second chamber antenna.

With this aspect of the invention, similar advantages and preferred features are present as in the previously discussed first aspect of the invention.

These and other features and advantages of the present invention will in the following be further clarified with reference to the embodiments described hereinafter.

BRIEF DESCRIPTION OF THE DRAWINGS

For exemplifying purposes, the invention will be described in closer detail in the following with reference to embodiments thereof illustrated in the attached drawings, wherein.

DETAILED DESCRIPTION

In the following detailed description, preferred embodiments of the present invention will be described. However, it is to be understood that features of the different embodiments are exchangeable between the embodiments and may be combined in different ways, unless anything else is specifically indicated. Even though in the following description, numerous specific details are set forth to provide a more thorough understanding of e present invention, it will be apparent to one skilled in the art that the present invention may be practiced without these specific details. In other instances, well-known constructions or functions are not described in detail, so as not to obscure the present invention.

Figure 1:
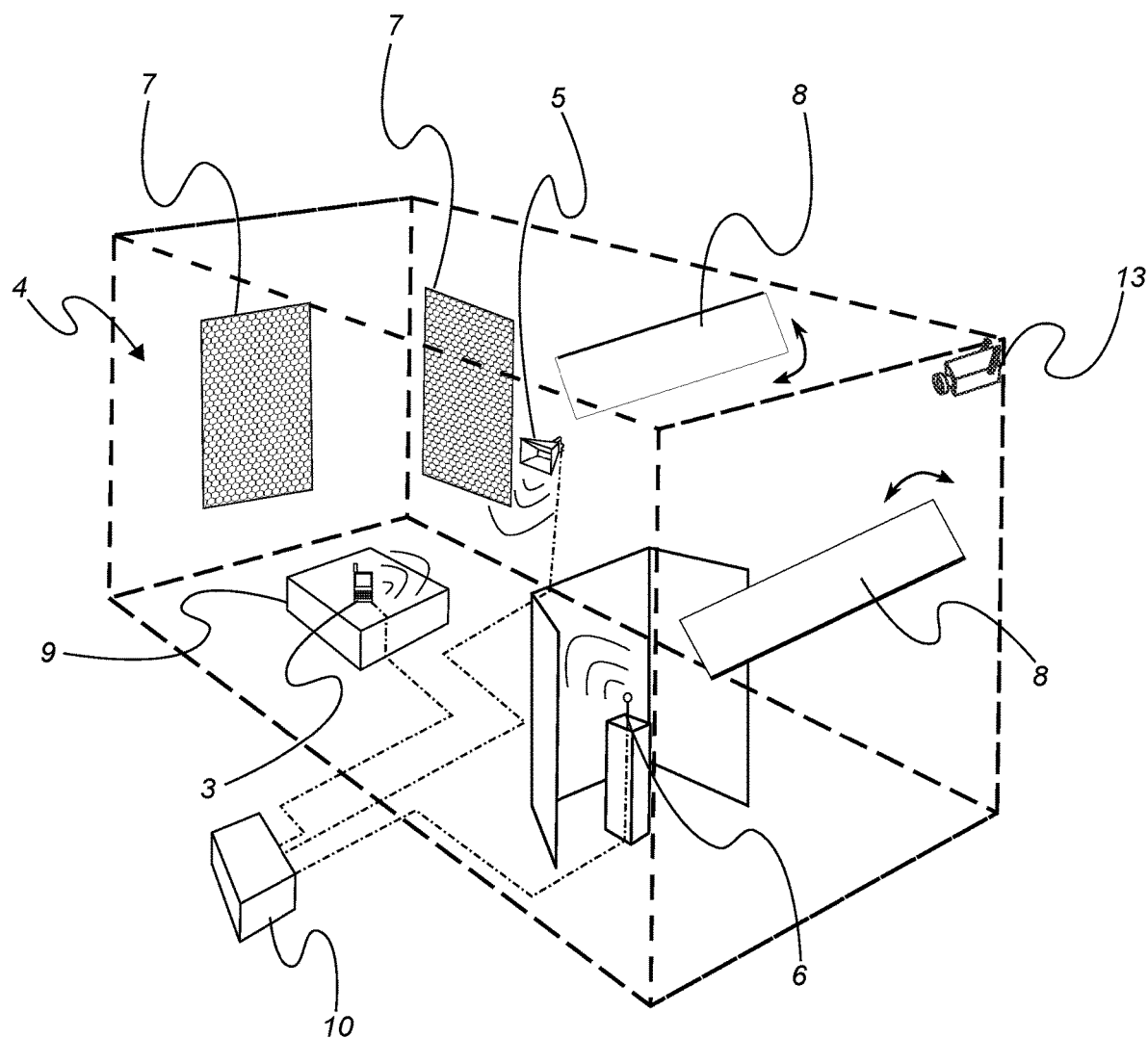
FIG. 1 is a perspective view showing a schematic illustration of a measurement arrangement according to an embodiment of the present invention.

FIG. 1 shows an embodiment of a measurement arrangement 1 for measuring the performance of a device under test 3, such as antennas, mobile or wireless terminals, and specifically for antennas and terminals intended to be used in a multipath environment. The measurement arrangement comprises a chamber 2, indicated by the broken lines. The chamber 2 defines/forms an internal cavity 4 and is arranged to enclose the device under test 3 within a set of walls having inwardly facing surfaces of an electromagnetically reflective material in order to simulate a multi-path environment. The walls can e.g. be provided with metallic foil or metallic plates on their inner surfaces.

The chamber 2 can have any size and shape. However, preferably, the chamber 2 is of a rectangular or cubic shape and dimensioned to be portable. For example, the chamber 2 can be arranged to define/form an internal cavity 4 with a space of 0.5 m$^3$ to 20 m$^3$. Other shapes, which are easy to realize, are vertical walls with flat floor and ceiling and with a horizontal cross-section that forms a circle, ellipse or polygon.

Further, there is provided at least one first chamber antenna 5 arranged in the cavity 4. The first chamber antenna(s) 5 could comprise a horn antenna, an electric monopole antenna, a helical antenna, a microstrip antenna, an electric monopole antenna or similar. The first chamber antenna(s) is connected to a measuring instrument 10. The first chamber antenna(s) 5 is furthermore configured to receive and transmit electromagnetic waves having a frequency within a first frequency range, preferably between 6 GHz and 100 GHz.

The first chamber antenna(s) 5 is preferably arranged with a free or direct line-of-sight in relation to the device under test 3, in order to introduce a line-of-sight component of the propagation channel to the device under test 3.

Even further, the measurement arrangement 1 comprises at least one second chamber antenna 6 within the cavity 4. The second chamber antenna(s) 6 is configured to transmit and receive electromagnetic waves having a frequency within a second predefined frequency range, preferably between 450 MHz and 6 GHz. Similarly to the first chamber antenna(s) 5, the second chamber antenna(s) 6 is connected to a measuring instrument 10. Furthermore, the second chamber antenna(s) 6 is preferably arranged at a height in the cavity such that the distance to the roof of the cavity is longer than the distance to the floor of the cavity. Further, the second chamber antenna(s) is here placed at a distance from the side walls, floor and ceiling of the chamber 2, and preferably this distance exceeds ½ wavelength used for testing from each wall, floor and ceiling of the chamber 2.

Figure 2:
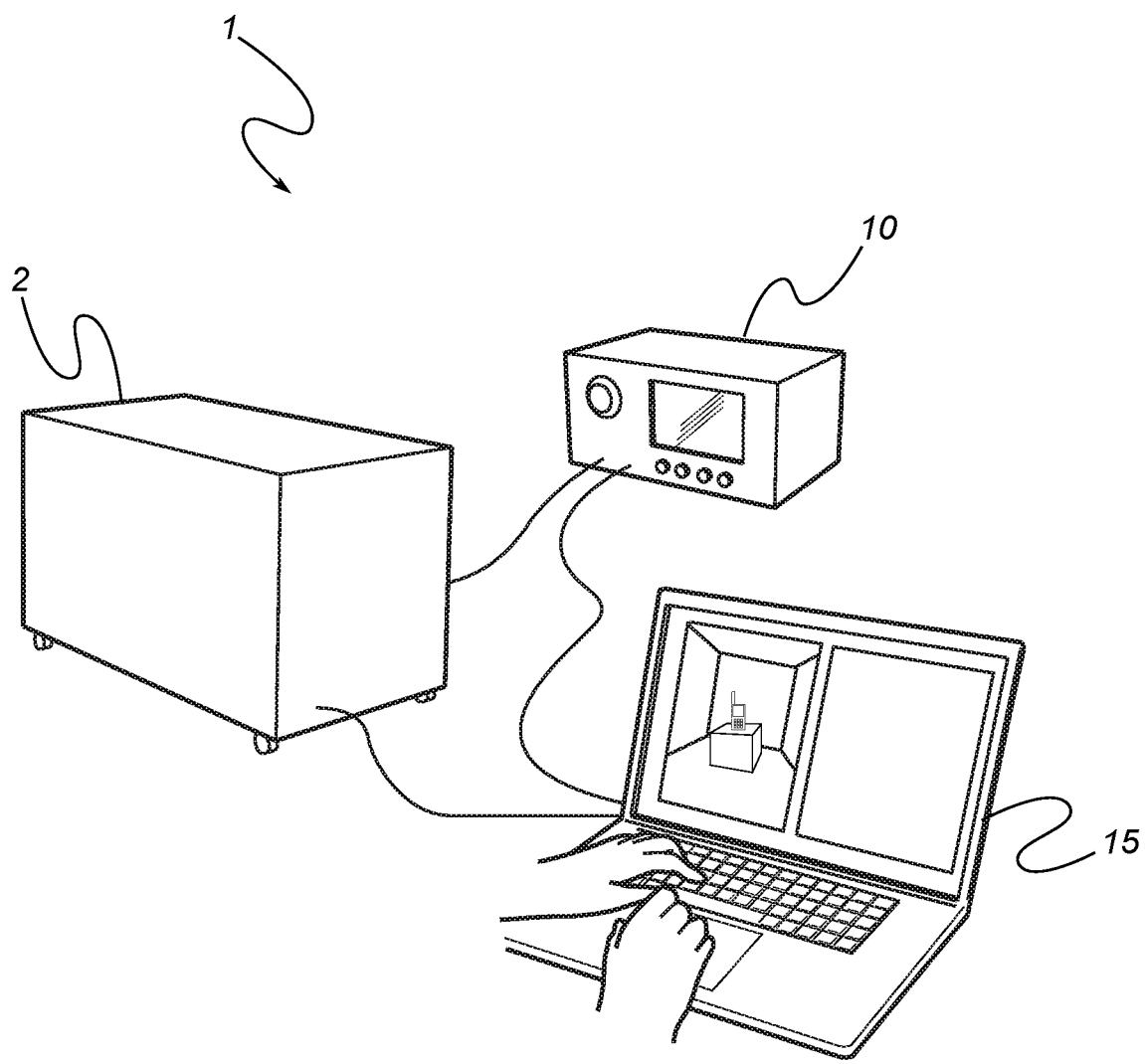
FIG. 2 is a perspective view showing a schematic illustration according to an embodiment of the present invention.

FIG. 2 illustrates a perspective view of the measurement arrangement 1 including a measuring instrument 10 connected to the device under test 3, and the chamber antenna(s) 5, 6 in order to measure the transmission between the chamber antennas(s) 5, 6 and the device under test 3 such that the performance of the device under test 3 can be measured and eventually characterized. The measuring instrument 10 may be a network analyzer or spectrum analyzer. The measurement arrangement 1 may further include analyzing means, as indicated in FIG. 2 by the computing device 15 (here in the form of a laptop or PC) which is connected to the measuring instrument 10.

Further, in FIG. 1, the measurement arrangement 1 comprises at least one frequency selective absorber 7, arranged on the inner surface of the sidewalls in this embodiment. The frequency selective absorber(s) is arranged to absorb electromagnetic waves having a frequency within the first predefined frequency range, i.e. within the range where the first chamber antenna 5 operates), and to reflect electromagnetic waves having a frequency within the second predefined frequency range, i.e. within the range where the second chamber antenna 6 operates. Thus, the fading environment in the chamber 2 is tuned such that it has different properties for different frequencies. This e.g. allows for testing of devices that simultaneously operate in different frequency bands and where the fading environments are tailored to each frequency band.

The measuring arrangement 1 further preferably comprises a shielding structure 13 arranged between the device under test 3 and the second chamber antenna(s) 6, such that a line of sight between the device under test and the second chamber antenna(s) is obscured by the shield. This is illustrated in FIG. 1. The shield may have a width extension between two opposing side walls of the chamber in the range 30-70%, and preferably 40-60%, of the distance between said opposing side walls, and a height extension between a ceiling and a floor of the chamber in the range 30-70%, and preferably 40-60%, of the distance between the floor and the ceiling.

The shield preferably has a non-linear extension in the width direction, and preferably a curved or angled extension, whereby the shielding structure partly surrounds the second chamber antenna(s) 6. In the embodiment illustrated in FIG. 1, the shielding structure has an angled extension.

The shielding structure is preferably moveable within the cavity. Hereby the shielding structure may be freely standing on the floor. However, alternatively, locking means or the like may be provided to fix the shielding structure in a desired position. Moreover, the shielding structure is provided with an electrically conductive surface such that it reflects a majority of incident electromagnetic waves transmitted from the second chamber antenna(s) 6. The shielding structure may alternatively be made of an electrically conductive material, such as e.g. a metal.

In the cavity 4 formed by the chamber 2, at least one moveable object can be provided. Such moveable objects that are used to obtain a mode distribution in the chamber 2 are per se well known in the art, and described in WO 2012/171562, by the same applicant, the document being incorporated herein by reference, and may take various forms. For example, the moveable object may comprise an object 8 which is rotatable around an axis of rotation, as illustrated in FIG. 1. Another possibility is to use elongated objects 8, such as plates, being displaceable by means of e.g. screws, which is rotated around by a driving means, such as a servo motor or a step motor, and a nut on this screw to which the elongate narrow object 8 is fastened (not shown). It is however possible to use other means for displacing the elongate object. The long narrow object has the form of a metal sheet, but it can also have many other forms, e.g. it is advantageous to give it an irregular form. The movement of the elongate object could be made intermittently between measurements or during a measurement, or even be performed continuously during a measurement. The moveable object may additionally or alternatively comprise a rotatable platform 9 such as a turntable, on which the device under test 3 is positioned. When using at least two moving objects 8, they could be moved simultaneously or sequentially. Thus, in one embodiment the device under test is movably arranged, e.g. on a turntable, whereas in another embodiment, the device under test is stationary in the chamber.

The moveable object(s) may functionally be referred to as field stirrer(s) or mode stirrer(s), and are preferably operable to be moved by rotation, translation, pivoting, etc. continuously across the length and/or width of the chamber. In this manner, continuous variation in the internal structure of the chamber is provided. The variation causes multiple changing reflections of electromagnetic waves within the chamber as the field stirrer scans. These changing reflected waves interfere with one another differently and form modes with varying excitations. Thereby, the number of independent samples increases, which is desirable for testing purposes as it mimics the multipath of the real environment in which such a device is to be used. Field stirring in this manner can produce the effect of a large number of excited modes and thus simulate a rich multipath environment.

The cavity may also include a near-in-structure in the form of e.g. a head phantom (not shown), a dielectric cylinder (not shown), a wooden box, as illustrated in FIG. 1, e.g. simulating a table surface, and the like.

Further, a video camera 13 may be arranged inside the cavity, as illustrated in FIG. 1. The video camera 13 is able to forward video information from the interior of the chamber to the exterior of the chamber during testing. The video information is preferably forwarded to the measurement instrument 10, and the video information may be correlated to the measuring data The video information is preferably recorded or stored in a memory, which enables to monitor the video information not only in real-time, but also subsequently, when analyzing the measurement data.

Further there is preferably provided a display arranged outside the cavity able to reproduce the video information received from the video camera. For example, the display may be mounted on an external wall of the chamber, and/or on a stand-alone measurement instrument 10 or analyzing instrument 15 such as a PC.

More general details and examples in relation to the measurement chamber and how it may be operated are available from U.S. Pat. Nos. 7,444,264 and 7,286,961, both said patents hereby being incorporated in their entirety by reference.

Figure 3A:
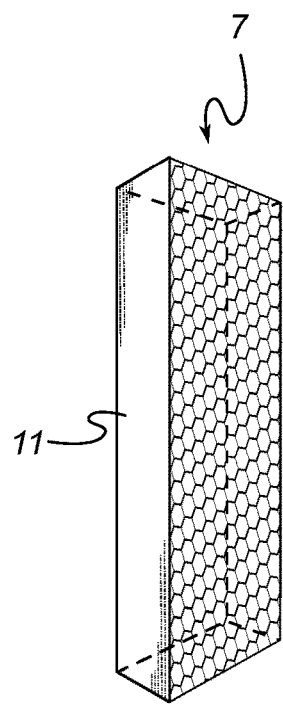
FIGS. 3a-f are perspective views showing illustrations of frequency selective absorbers according to embodiments of the present invention.

In FIG. 3a a schematic illustration of a frequency selective absorber 7 according to an embodiment of the present invention is shown. The frequency selective absorber comprises an absorbing body 11 at least partly covered by a electrically conductive grid 12, here in the form of a metallic grid or a wire mesh (also known as a "chicken-wire"). The term reflective is to be understood as capable of reflecting electromagnetic waves propagating towards the electrically conductive grid 12. Thus, the electrically conductive grid 12 is made of an electrically conductive material; preferably it is made of a metal such as e.g. copper, aluminum, or similar. The absorbing body 11 may be partly or completely enclosed by the electrically conductive grid 12, depending on the intended application.

An electromagnetic wave (such as a radio signal) incident on the electrically conductive grid 12 is mostly reflected with a minor amount transmitted through the screen, if the size of the holes or openings are small relative to the wavelength of the electromagnetic wave. Conversely if the holes or openings are large relative to the wavelength of the electromagnetic wave the signal is mostly transmitted with a minor amount reflected. The absorbing bodies can for example be carbon loaded foam absorbers (e.g. urethane foam loaded with conductive carbon black particles or crystalline graphite particles) or any other suitable radiation-absorbent material (RAM).

Figure 3B:
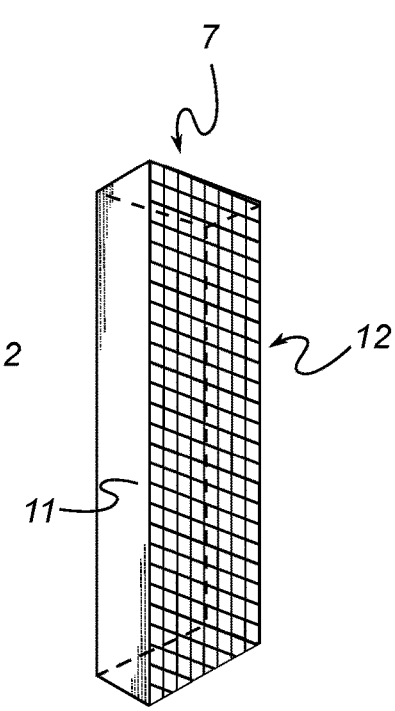

FIG. 3b is a schematic illustration of a frequency selective absorber 7 according to another embodiment of the present invention. Here the absorbing body 11 is covered by an electrically conductive grid 12 in the form of a square wire mesh.

Figure 3C:
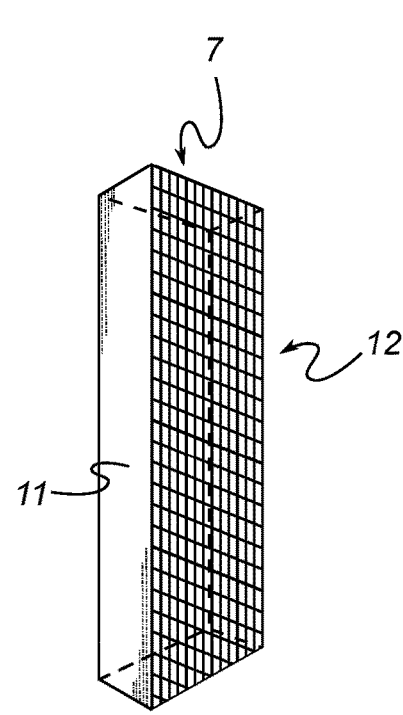

FIG. 3c is a schematic illustration of a frequency selective absorber 7 according to yet another embodiment of the present invention. Here the absorbing body 11 is covered by an electrically conductive grid in the form of a rectangular wire mesh. By having a non symmetrical wire mesh, i.e. the openings or holes having an extension that is longer in one direction compared to the other allows for controlling the reflection of incident electromagnetic waves based on polarization as well as frequency. In other words, the electrically conductive grid 12 is arranged with rectangular holes whereby the frequency selective absorber attenuates incident electromagnetic waves based on the polarization of the incident electromagnetic waves.

Figure 3D:
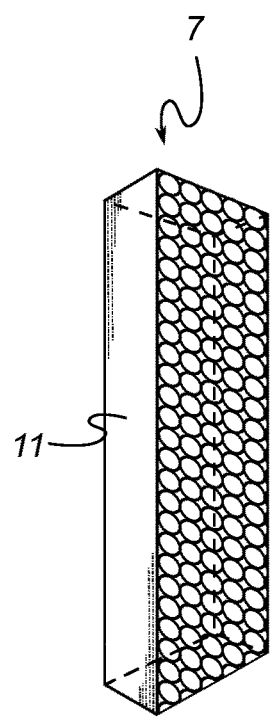

Further, FIG. 3d is another schematic illustration of a frequency selective absorber 7 in accordance with yet another embodiment of the present invention. The absorbing body 11 is at least partly covered with an electrically conductive grid, 12 here in the form of a circular wire mesh. The openings can either be symmetrical circles in order to give similar transmission and reflection properties independent of the polarization of the incident electromagnetic wave. However, in some embodiments of the present invention the openings are oval whereby different characteristics of different polarizations can be achieved.

Figure 3E:
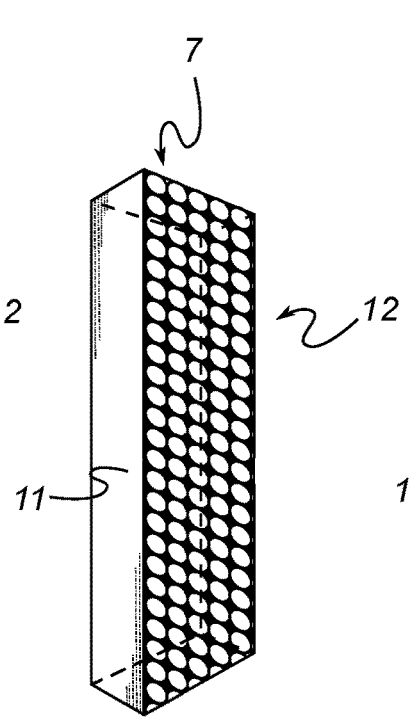

FIG. 3e illustrates another embodiment of the present invention of a frequency selective absorber 7 having an absorbing body 11 at least partly covered by an electrically conductive grid 12, in the form of a perforated electrically conductive sheet having a grid of circular holes. Similarly to the above discussion the holes or openings may be oval in order to achieve different transmission-reflection characteristics based on the polarization of the incident electromagnetic wave.

Figure 3F:
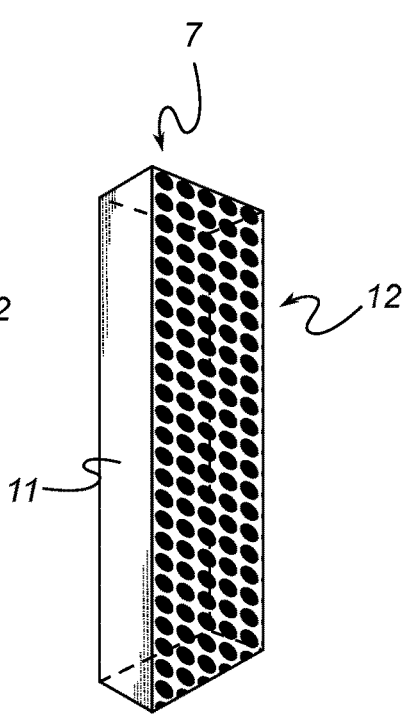

FIG. 3f illustrates yet another embodiment of the present invention of a frequency selective absorber 7. In this embodiment, the grid 12 is inverted as compared to the frequency selective absorber illustrated in FIG. 2e, i.e. areas that are holes in the grid in FIG. 2e are here in FIG. 2f solid electrical conductors (e.g. a grid of metallic "islands") and the area in between the "islands" are open. Hereby, it is possible to invert the loss behavior as compared to the embodiments illustrated in FIGS. 2a-e such that incident electromagnetic waves of a low frequency experience more loss/absorption than those of a high frequency.

Figure 4:
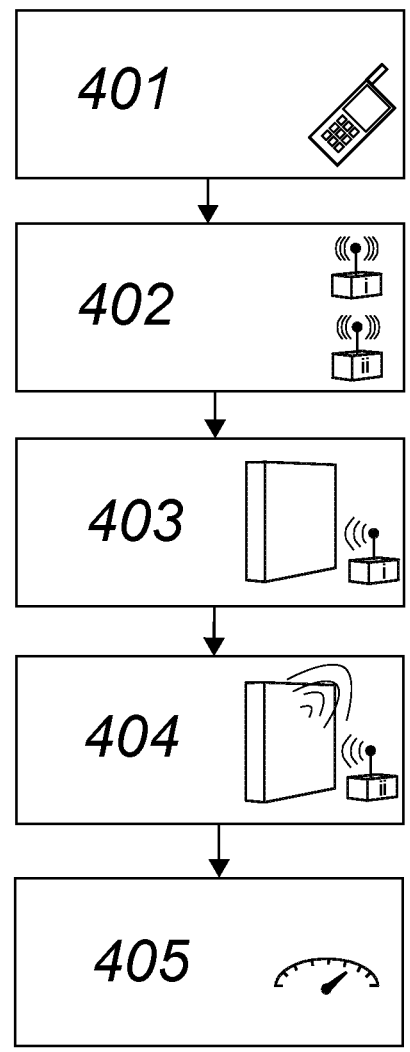
FIG. 4 is a schematic flow-chart representation of a method for measuring the performance of a device under test according to an embodiment of the present invention.

In FIG. 4 a schematic flow-chart representation of a method for measuring the performance of a device under test according to an embodiment of the present invention is illustrated. The method includes arranging 401 a device under test within a chamber defining an internal cavity therein. The chamber further includes walls having inwardly facing surfaces of an electromagnetically reflective material in order to simulate a multi-path environment. For example, such a chamber is often referred to as a reverberation chamber and is illustrated in FIGS. 1-2. Furthermore, the method includes arranging 402 at least one first antenna (i) in the cavity of the chamber and at least one second antenna (ii) in the same cavity. The first antenna is configured to transmit/receive electromagnetic waves of a first predefined frequency range (frequency band). The first predefined frequency range/band is preferably within the range from 450 MHz to 6000 MHz. The second antenna is then configured to transmit/receive electromagnetic waves of a second predefined frequency range (frequency band). The second predefined frequency band is preferably within the range from 6 GHz to 200 GHz.

Further, the method includes absorbing 403 electromagnetic waves of the first predefined frequency range transmitted within the chamber, i.e. transmitted in the cavity. In other words the electromagnetic waves or radio signals transmitted by the first chamber antenna(s) are at least to some extent absorbed, preferably by means of the frequency selective absorber(s) arranged in the cavity of the chamber as discussed above. Further, the method includes reflecting 404 electromagnetic waves of the second predefined frequency range transmitted within the chamber, i.e. transmitted in the cavity. Meaning that the electromagnetic waves or radio signal transmitted by the second chamber antenna(s) are reflected, preferably by means of the frequency selective absorber(s) arranged in the cavity. Next, the method also includes measuring 405 a transmission between the device under test (e.g. mobile phone) and the first chamber antenna(s) and the second chamber antenna(s). Preferably, the first and second chamber antennas are operated simultaneously such that the measuring 405 is performed at both attenuated and non-attenuated frequency ranges/bands.

The invention has now been described with reference to specific embodiments. However, several variations of the measurement arrangement are feasible. For example, the various features discussed in the foregoing may be combined in various ways. Such and other obvious modifications must be considered to be within the scope of the present invention, as it is defined by the appended claims. It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting to the claim. The word "comprising" does not exclude the presence of other elements or steps than those listed in the claim. The word "a" or "an" preceding an element does not exclude the presence of a plurality of such elements. Further, a single unit may perform the functions of several means recited in the claims.

The invention claimed is:

1. A measurement arrangement for measuring the performance of a device under test, comprising:
a chamber defining an internal cavity therein, adapted to enclose the device under test, and including walls having inwardly facing surfaces of an electromagnetically reflective material, thereby simulating a multipath environment;
at least one first chamber antenna arranged in the cavity and configured to transmit and receive electromagnetic waves having a frequency within a first predefined frequency range;
at least one second chamber antenna arranged in the cavity and configured to transmit and receive electromagnetic waves having a frequency within a second predefined frequency range;
a measuring instrument connected to the device under test and the first chamber antenna and the second chamber antenna, for measuring the transmission between said device under test and the chamber antennas;
wherein said measurement arrangement further comprises at least one frequency selective absorber arranged in the cavity, said frequency absorber being arranged to absorb electromagnetic waves having a frequency within said first predefined frequency range and reflect electromagnetic waves having a frequency within said second predefined frequency range;
wherein said at least one first chamber antenna and said at least one second chamber antenna are arranged to operate simultaneously;
wherein said first predefined frequency range is at a higher frequency band than said second predefined frequency range; and
wherein said first and second predefined frequency ranges are distinct and non-overlapping in relation to each other.

2. The measurement arrangement according to claim 1, wherein said first predefined frequency range is above 1 GHz, preferably above 5 GHz, and most preferably above 10 GHz.

3. The measurement arrangement according to claim 1, wherein said first predefined frequency range is within the range between 5 GHz and 200 GHz, preferably between 6 GHz and 150 GHz and most preferably between 6 GHz and 100 GHz.

4. The measurement arrangement according to claim 1, wherein said second predefined frequency range is below 10 GHz, preferably below 5 GHz, and most preferably below 1 GHz.

5. The measurement arrangement according to claim 1, wherein said second predefined frequency range is within the range between 100 MHz and 10 GHz, preferably between 400 MHz and 8.5 GHz and most preferably between 450 MHz and 6 GHz.

6. The measurement arrangement according to claim 1, wherein said at least one first chamber antenna and said at least one second chamber antenna are arranged at spatially separated locations in the cavity.

7. The measurement arrangement according to claim 1, wherein said at least one first chamber antenna is arranged with a free line-of-sight to said device under test.

8. The measurement arrangement according to claim 1, further comprising a shielding structure arranged between the device under test and said at least one second chamber antenna, such that a line of sight between the device under test and said at least one second chamber antenna is obscured.

9. The measurement arrangement according to claim 1, wherein the frequency selective absorber comprises an absorbing body at least partially covered on a surface thereof by an electrically conductive grid, such as a mesh.

10. The measurement arrangement according to claim 9, wherein said electrically conductive grid comprises holes of a predefined dimension, said predefined dimension being based on a wavelength of transmitted electromagnetic waves from the first chamber antenna.

11. The measurement arrangement according to claim 1, wherein said frequency selective absorber is at least partly provided on the walls of the chamber, thereby at least partly covering the inwardly facing surfaces of said walls.

12. A method for measuring the performance of a device under test, comprising:
- arranging a device under test within a chamber defining an internal cavity therein, and including walls having inwardly facing surfaces of an electromagnetically reflective material, thereby simulating a multi-path environment;
- arranging at least one first chamber antenna in the cavity and at least one second chamber antenna in the cavity, wherein said at least one first chamber antenna is configured to transmit and/or receive electromagnetic waves of a first predefined frequency range and said at least one second chamber antenna is configured to transmit and/or receive electromagnetic waves of a second predefined frequency range;
- absorbing electromagnetic waves of said first predefined frequency range transmitted within said chamber;
- reflecting electromagnetic waves of said second predefined frequency range transmitted within said chamber; and
- measuring a transmission between the device under test and said at least one first chamber antenna and said at least one second chamber antenna;
- wherein said at least one first chamber antenna and said at least one second chamber antenna are arranged to operate simultaneously;
- wherein said first predefined frequency range is at a higher frequency band than said second predefined frequency range; and
- wherein said first and second predefined frequency ranges are distinct and non-overlapping in relation to each other.

* * * * *